United States Patent
Jeong (10) Patent No.: US 8,129,727 B2
(45) Date of Patent: Mar. 6, 2012

(54) SEMICONDUCTOR LIGHT EMITTING DEVICE

(75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 231 days.

(21) Appl. No.: 12/508,365

(22) Filed: Jul. 23, 2009

(65) Prior Publication Data

US 2010/0019264 A1  Jan. 28, 2010

(30) Foreign Application Priority Data

Jul. 24, 2008 (KR) .................. 10-2008-0072184

(51) Int. Cl.
*H01L 33/00* (2010.01)
(52) U.S. Cl. ............. 257/79; 257/86; 257/93; 257/103; 257/E23.062
(58) Field of Classification Search .................. None
See application file for complete search history.

(56) References Cited

U.S. PATENT DOCUMENTS

| | | | |
|---|---|---|---|
| 7,244,957 B2 * | 7/2007 | Nakajo et al. ................. 257/13 |
| 2002/0028527 A1 | 3/2002 | Maeda et al. | |
| 2005/0238076 A1 * | 10/2005 | Kuwata et al. ............ 372/50.1 |
| 2007/0080420 A1 | 4/2007 | Kim et al. | |

FOREIGN PATENT DOCUMENTS

| KR | 10-2006-0004504 A | 1/2006 |
|---|---|---|
| KR | 10-2007-0118849 A | 12/2007 |

* cited by examiner

*Primary Examiner* — N Drew Richards
*Assistant Examiner* — Mamadou Diallo
(74) *Attorney, Agent, or Firm* — Birch, Stewart, Kolasch & Birch, LLP (57) ABSTRACT

A semiconductor light emitting device including a second electrode layer; a light emitting unit including a plurality of compound semiconductor layers under one portion of the second electrode layer; a first insulating layer under the other portion of the second electrode; an electrostatic protection unit including a plurality of compound semiconductor layer under the first insulating layer; a first electrode layer electrically connecting the light emitting unit to the electrostatic protection unit; and a wiring layer electrically connecting the electrostatic protection unit to the second electrode layer.

19 Claims, 6 Drawing Sheets

SEMICONDUCTOR LIGHT EMITTING DEVICE

CROSS-REFERENCE TO RELATED APPLICATIONS

The present application claims priority under 35 U.S.C. 119 to Korean Patent Application No. 10-2008-0072184 (filed on Jul. 24, 2008), which is hereby incorporated by reference in its entirety.

BACKGROUND OF THE EMBODIMENTS

1. Field of the Disclosure

Embodiments of the disclosure relate to a semiconductor light emitting device.

2. Discussion of the Background Art

Group III-V nitride semiconductors have been variously applied to optical devices having blue and green Light Emitting Diodes (LED), high-speed switching devices such as a Metal Semiconductor Field Effect Transistor (MOSFET) and a Hetero junction Field Effect Transistors (HEMT), and light sources such as an illumination or display device. In some background devices, a light emitting device using a group III nitride semiconductor has a direct transition band gap corresponding to the range between visible rays and ultraviolet rays, realizing highly efficient light emission.

Conventionally, nitride semiconductors are mainly used for LEDs or Laser Diodes (LD). Studies on ways of improving manufacturing processes and optical efficiency are being carried out.

SUMMARY OF THE DISCLOSURE

One embodiment provides a semiconductor light emitting device that includes a light emitting unit including a plurality of compound semiconductor layers and an electrostatic protection unit.

Another embodiment provides a semiconductor light emitting device in which the light emitting unit and the electrostatic protection unit include the same semiconductor layer structure.

Another embodiment provides a semiconductor light emitting device that can reinforce an electrostatic discharge (ESD) immunity of the light emitting unit.

Another embodiment provides a semiconductor light emitting device including: a second electrode layer; a light emitting unit including a plurality of compound semiconductor layers under one side of the second electrode layer; a first insulating layer under the other side of the second electrode layer; an electrostatic protection unit including a plurality of compound semiconductor layer under the first insulating layer; a first electrode layer electrically connecting the light emitting unit to the electrostatic protection unit; and a wiring layer electrically connecting the electrostatic protection unit to the second electrode layer.

Another embodiment provides a semiconductor light emitting device including: a second electrode layer including reflective metal; a first insulating layer under at least a part of the second electrode layer; a light emitting unit including a plurality of compound semiconductor layers under the second electrode layer; an electrostatic protection unit including a plurality of compound semiconductor layers under the first insulating layer; a first electrode layer electrically connecting the light emitting unit to the electrostatic protection unit; and a wiring layer electrically connecting the electrostatic protection unit to the second electrode layer.

Another embodiment provides a semiconductor light emitting device including: a second electrode layer including reflective metal; a first insulating layer on the outer circumference of the bottom surface of the second electrode layer; a light emitting unit including a plurality of compound semiconductor layers under the second electrode layer; an electrostatic protection unit including a plurality of compound semiconductor layers under the first insulating layer; a second contact layer between the electrostatic protection unit and the first insulating layer; a first electrode layer electrically connecting the light emitting unit to the second contact layer; and a wiring layer electrically connecting the electrostatic protection unit to the second electrode layer.

DETAILED DESCRIPTION OF THE EMBODIMENTS

Reference will now be made in detail to the embodiments of the present disclosure, examples of which are illustrated in the accompanying drawings.

In the following description, it will be understood that when a layer or film is referred to as being 'on' another layer or substrate, it may be directly on the other layer or substrate, or intervening layers may also be present. Further, it will be understood that when a layer is referred to as being 'under' another layer, it may be directly under the other layer, and one or more intervening layers may also be present. In addition, it will also be understood that when a layer is referred to as being 'between' two layers, it may be the only layer between the two layers, or one or more intervening layers may also be present.

Figure 1:
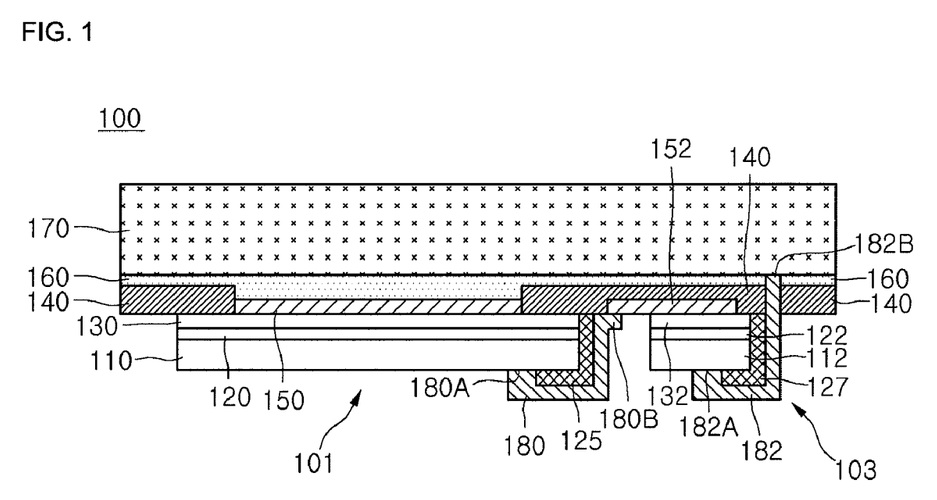
FIG. 1 is a side cross-sectional view showing a semiconductor light emitting device according to the embodiment.
Figure 2:
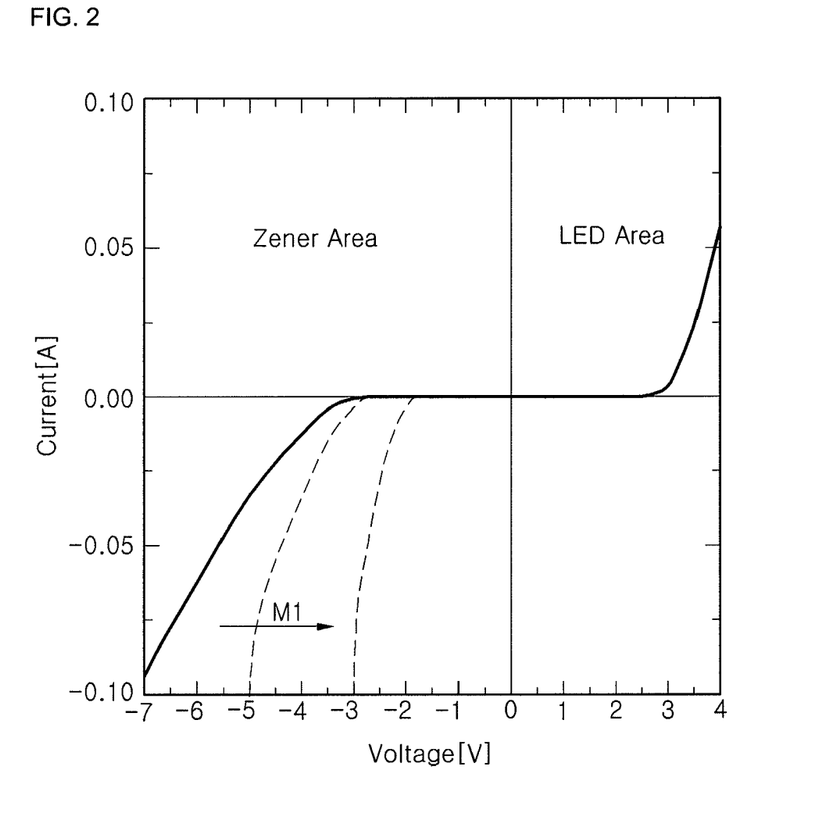
FIG. 2 is a graph showing the operation characteristics of the light emitting device and the protection device of FIG. 1.

FIG. 1 is a side cross-sectional view showing a semiconductor light emitting device according to one embodiment, and FIG. 2 is a graph showing the operation characteristics of FIG. 1.

Referring to FIG. 1, the semiconductor light emitting device 100 includes a light emitting unit 101, an electrostatic protection unit 103, a second electrode layer 160, a conductive supporting member 170, a first electrode layer 180, and a wiring layer 182.

The semiconductor light emitting device 100 includes a LED (light emitting diode) using a III-V group compound semiconductor, wherein the LED may be a colored LED that emits light having blue, green or red, etc. or a UV (ultraviolet) LED. The light emitted from the LED may be implemented variously within the technical scope of the embodiment.

The light emitting unit 101 and the electrostatic projection unit 103 include a plurality of semiconductor layers using a III-V group compound semiconductor. Also, the light emitting unit 101 and the electrostatic projection unit 103 are formed having the same semiconductor layer structure.

The light emitting unit 101 includes a first conductive type semiconductor layer 110, a first active layer 120, and a second conductive type semiconductor layer 130. The electrostatic projection unit 103 includes a third conductive type semiconductor layer 112, a second active layer 122, and a fourth conductive type semiconductor layer 132.

The first conductive type semiconductor layer 110 is formed of the same semiconductor material as the third conductive type semiconductor layer 112. The first active layer 120 is formed of the same semiconductor material as the second active layer 122. The second conductive type semiconductor layer 130 is formed of the same semiconductor material as the fourth conductive type semiconductor layer 132.

The first conductive type semiconductor layer 110 and the third conductive type semiconductor layer 112 may be selected from the III-V group compound semiconductor doped with a first conductive dopant, for example, GaN, AlN, AlGaN, InGaN, InN, InAlGaN, AlInN, AlGaAs, GaP, GaAs, GaAsP, and AlGaInP, etc. When the first conductive type is a N type semiconductor layer, the first conductive type dopant includes a N type dopant such as Si, Ge, Sn, Se, and Te, etc. The first conductive type semiconductor layer 110 and the third conductive type semiconductor layer 112 may be formed in a single layer or a multi layer, and they are not limited thereto.

A roughness pattern may be formed in the bottom surface of the first conductive type semiconductor layer 110.

The first active layer 120 is formed on the first conductive type semiconductor layer 110, and the second active layer 122 is formed on the third conductive type semiconductor layer 112.

The first active layer 120 and the second active layer 122 may be formed having a single quantum well structure or a multi-quantum well structure. The first and second active layers 120 and 122 may be formed having a period of a well layer/a barrier layer using the III-V group compound semiconductor material, for example, having at least one of InGaN well layer/GaN barrier layer, InGaN well layer/InGaN barrier layer, InGaN well layer/AlGaN barrier layer, and AlGaN well layer/AlGaN barrier layer.

A conductive clad layer may be formed on and/or under the first active layer 120 and the second active layer 122, wherein the conductive clad layer may be formed a AlGaN based semiconductor.

The second conductive type semiconductor layer 130 is formed on the first active layer 120, and the fourth conductive type semiconductor layer 132 is formed on the second active layer 120.

The second conductive type semiconductor layer 130 and the fourth conductive type semiconductor layer 132 may be selected from the III-V group compound semiconductor doped with a second conductive dopant, for example, GaN, AlN, AlGaN, InGaN, InN, InAlGaN, AlInN, AlGaAs, GaP, GaAs, GaAsP, and AlGaInP, etc. When the second conductive type is a P type semiconductor layer, the second conductive type dopant includes a P type dopant such as Mg and Ze, etc. The second conductive type semiconductor layer 130 and the fourth conductive type semiconductor layer 132 may be formed in a single layer or a multi layer, and they are not limited thereto.

Another conductive type semiconductor layer (not shown), for example, a N type semiconductor layer or a P type semiconductor layer, may be formed on the second conductive type semiconductor layer 130. Another conductive type semiconductor layer (not shown), for example, a N type semiconductor layer or a P type semiconductor layer, may be formed on the fourth conductive type semiconductor layer 132.

Here, the first and third conductive type semiconductor layers 110 and 112 may be formed as the P type semiconductors, and the second and fourth conductive type semiconductor layers 130 and 132 may be formed as the N type semiconductors. Therefore, the light emitting unit 101 and the electrostatic protection unit 103 may comprise at least one of a N-P junction structure, a P-N junction structure, N-P-N junction structure, and a P-N-P junction structure.

Meanwhile, a first electrode layer 180 is formed under the first conductive type semiconductor layer 110. The first electrode layer 180 may be formed in a predetermined pattern, and it is not limited thereto. One end 180A of the first electrode layer 180 is connected to the bottom of the first conductive type semiconductor layer 110, and the other end 180B of the first electrode layer 180 is connected to a second contact layer 152 of the electrostatic protection unit 103.

A wiring layer 182 is formed under the third conductive type semiconductor layer 112, wherein the wiring layer 182 may be formed in a predetermined wiring pattern including an electrode pattern or a conductive material line pattern.

One end 182A of the wiring layer 182 is connected to the bottom of the third conductive type semiconductor 112, and the other end 182B thereof is directly or indirectly contacted to the conductive supporting member 170.

A second electrode layer 160 is formed on the light emitting unit 101 and the electrostatic protection unit 103, and the conductive supporting member 170 is formed on the second electrode layer 160.

The second electrode layer 160 may be formed of at least one of Al, Ag, Pd, Rh and Pt, a metal material of a reflectivity of 50% or more, etc. or a alloy thereof, and the conductive supporting member 170 may be implemented as copper (Cu), gold (Au), nickel (Ni), molybdenum (Mo), copper-tungsten (Cu—W), carrier wafers (e.g.: Si, Ge, GaAs, ZnO, and Sic etc.). The conductive supporting member 160 may be formed using an electro deposition method, and it is not limited thereto.

The second electrode layer 160 and the conductive supporting member 170 may be defined as a second electrode unit that supplies power of a second polarity, and the second electrode unit may be formed of electrode material in a single layer or a multi layer, or may be attached using adhesives.

A first insulating layer 140 is formed on the outer circumference of the bottom surface of the second electrode layer 160. The first insulating layer 140 may be formed in any one shape of a band shape, a ring shape, and a frame shape. The first insulating layer 140 may allow the interval between the second electrode layer 160 and the light emitting unit 101 to be spaced. The first insulating layer 140 may be formed of insulating material such as $SiO_2$, $Si_3N_4$, $Al_2O_3$, and $TiO_2$, etc. The electrostatic projection unit 103 may be disposed under the other side of the first insulating layer 140.

A first contact layer 150 may be formed between the second electrode layer 160 and the second conductive type semiconductor layer 130 of the light emitting unit 101, and a second contact layer 152 may be formed between the first insulating layer 140 and the fourth conductive type semiconductor layer 132 of the electrostatic protection unit 103.

The first contact layer 150 and the second contact layer 152 may be selectively formed of ITO, IZO(In—ZnO), GZO (Ga—ZnO), AZO(Al—ZnO), AGZO(Al—Ga ZnO), IGZO (In—Ga ZnO), IrOx, RuOx, Ni/IrOx/Au, Ni/IrOx/Au/ITO, Ag, Ni, Al, Rh, Pd, Ir, Ru, Mg, Zn, Pt, Au, Hf, a metallic oxide and material consisting of a selective combination thereof. The first contact layer 150 and the second contact layer 152 are formed as ohmic contact characteristics, making it possible to improve electrical characteristics.

The first contact layer 150 and/or the second contact layer 152 may be formed in a layer or plural patterns, and they may be modified variously within the technical range of the embodiment. Also, the first contact layer 150 may not be formed.

The first insulating layer 140 is formed on the second contact layer 152 to allow it to be electrically opened with the second electrode layer 160.

The first electrode layer 180 electrically connects the first conductive type semiconductor layer 110 to the second contact layer 152. In this case, the second insulating layer 125 prevents the interlayer short of the light emitting unit 101. The second insulating layer 125 is formed between the first electrode layer 180 and the respective layers 110, 120, and 130 of the light emitting unit 101, thereby preventing the interlayer short of the light emitting unit 101 by the first electrode layer 180.

The wiring layer 182 allows between the third conductive type semiconductor layer 112 of the electrostatic protection unit 103 and the second electrode layer 160 to be electrically connected. In this case, a third insulating layer 127 prevents the interlayer short of the electrostatic protection unit 103. The third insulating layer 127 is formed between the respective layers 112, 122, and 132 of the electrostatic protection unit 103, thereby preventing the interlayer short of the electrostatic protection unit 103 by the wiring layer 182.

The first insulating layer 140, the second insulating layer 125, and the third insulating layer may be formed having a thickness of about 0.1 to 2 μm, respectively, and they are not limited thereto.

The electrostatic protection unit 103 is connected to the light emitting unit 101 in parallel based under the second electrode layer 160, making it possible to protect the light emitting unit 101. Here, the electrostatic protection unit 103 may be formed having a size below 50% within the semiconductor light emitting device 100.

The light emitting unit 101 and the electrostatic protection unit 103 are spaced and integrated in the semiconductor light emitting device 100, making it possible to protect the light emitting unit 101 from ESD.

If a forward direction bias is supplied through the first electrode layer 180 and the conductive supporting member 170, the semiconductor light emitting device 100 is operated in a LED region as shown in FIG. 2. Also, if abnormal voltage is applied such as ESD (electrostatic discharge), the electrostatic protection unit 103 is operated in a zener area as shown in FIG. 2, thereby protecting the light emitting unit 101. Here, if the size of the electrostatic protection unit 103 is increased, the protecting characteristics of the zener area is moved in a M1 direction, thereby making it possible to protect the light emitting unit 100 from ESD of 5 KV or more.

The embodiment can provide the vertical semiconductor light emitting device 100 having the electrostatic protection unit with strong ESD immunity, making it possible to improve the electrical reliability of the vertical semiconductor light emitting device.

FIGS. 3 to 12 are diagrams showing manufacturing processes of the semiconductor light emitting device according to the embodiment.

Figure 3:
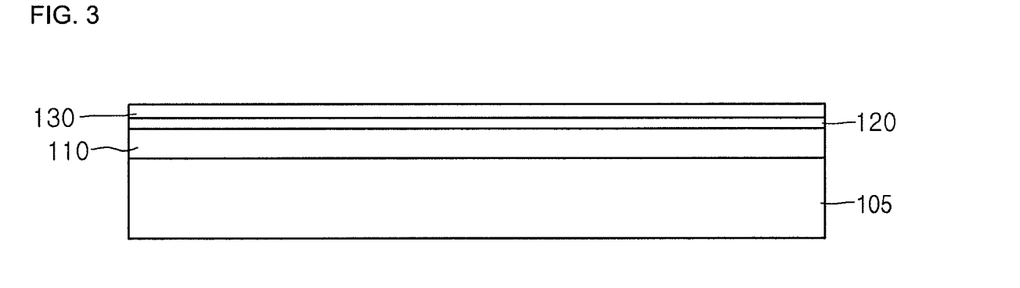
FIGS. 3 to 12 are diagrams showing manufacturing processes of the semiconductor light emitting device according to the embodiment.
Figure 4:
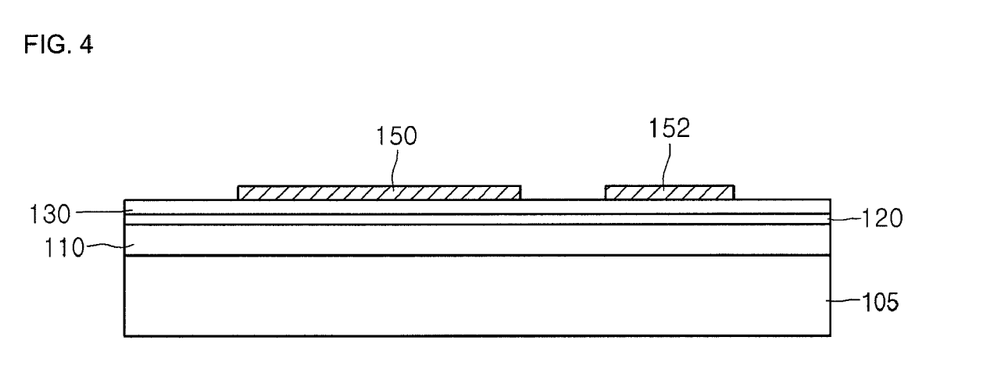

Referring to FIGS. 3 and 4, a substrate 105 is loaded as a growth apparatus. The growth apparatus may be formed by an electron beam evaporator, a physical vapor deposition (PVD), a chemical vapor depositing (CVD), a plasma laser deposition (PLD), a dual-type thermal evaporator, a sputtering, and a metal organic chemical vapor deposition (MOCVD), etc., but it is not limited thereto.

A plurality of semiconductor layers may be formed on the substrate 105 using a II to VI group compound semiconductor.

A first conductive type semiconductor layer 110 is formed on the substrate 105, a first active layer 120 is formed on the first conductive type semiconductor layer 110, and a second conductive type semiconductor layer 130 is formed on the first active layer 120.

The substrate 105 may be selected from a group consisting of sapphire substrate ($Al_2O_3$), GaN, SiC, ZnO, Si, GaP, InP, $Ga_2O_3$, an insulation substrate, a conductive substrate, and GaAs, etc. An unevenness pattern may be formed on the upper surface of the substrate 105. Also, a layer using the II-VI group compound semiconductor, for example, a buffer layer and/or an undoped semiconductor layer, may also be formed on the substrate 105.

The first conductive type semiconductor layer 110 may be selected from the III-V group compound semiconductor doped with a first conductive dopant, for example, GaN, AlN, AlGaN, InGaN, InN, InAlGaN, AlInN, AlGaAs, GaP, GaAs, GaAsP, and AlGaInP, etc. When the first conductive type is a N type semiconductor layer, the first conductive type dopant includes a N type dopant such as Si, Ge, Sn, Se, and Te, etc. The first conductive type semiconductor layer 110 may be formed in a single layer or a multi layer, and it is not limited thereto.

The first active layer 120 is formed on the first conductive type semiconductor layer 110, wherein the first active layer 120 may be formed having a single quantum well structure or a multi quantum well structure.

The first active layer 120 may be formed having a period of a well layer/a barrier layer using the III-V group compound semiconductor material, for example, having at least one of InGaN well layer/GaN barrier layer, InGaN well layer/InGaN barrier layer, InGaN well layer/AlGaN barrier layer, and AlGaN well layer/AlGaN barrier layer.

A conductive clad layer (not shown) may be formed on and/or under the first active layer 120, wherein the conductive clad layer may be formed a AlGaN based semiconductor.

The second conductive type semiconductor layer 130 is formed on the first active layer 120, wherein the second conductive type semiconductor layer 130 may be selected from the III-V group compound semiconductor doped with a second conductive dopant, for example, GaN, AlN, AlGaN, InGaN, InN, InAlGaN, AlInN, AlGaAs, GaP, GaAs, GaAsP, and AlGaInP, etc. When the second conductive type is a P type semiconductor layer, the second conductive type dopant includes a P type dopant such as Mg and Ze, etc. The second conductive type semiconductor layer 130 may be formed in a single layer or a multi layer, and is not limited thereto.

Another conductive type semiconductor layer (not shown), for example, a N type semiconductor layer or a P type semiconductor layer, may be formed on the second conductive type semiconductor layer 130.

Here, the first conductive type semiconductor layer 110 may be formed as the P type semiconductor, and the second conductive type semiconductor layer 130 may be formed as the N type semiconductor. Therefore, at least any one of a N-P junction structure, a P-N junction structure, N-P-N junction structure, and a P-N-P junction structure may be formed on the substrate 105.

A first contact layer 150 and a second contact layer 152 are formed in a predetermined area using a mask patterns on the second conductive type semiconductor layer 130.

The first contact layer 150 is formed in one area on the second conductive type semiconductor layer 130, and the second contact layer 152 is formed on the other area thereon. The first contact layer 150 may not be formed.

The first and second contact layers 150 and 152 may be selectively formed of ITO, IZO(In—ZnO), GZO(Ga—ZnO), AZO(Al—ZnO), AGZO(Al—Ga ZnO), IGZO(In—Ga ZnO), IrOx, RuOx, Ni/IrOx/Au, Ni/IrOx/Au/ITO, Ag, Ni, Al, Rh, Pd, Ir, Ru, Mg, Zn, Pt, Au, Hf, a metallic oxide, and material consisting of a selective combination thereof. The first contact layer 150 and the second contact layer 152 are formed to have ohmic contact characteristics, making it possible to improve electrical characteristics.

The first contact layer 150 and/or the second contact layer 152 may be formed in a layer or a pattern, and they may be modified variously within the technical range of the embodiment. Also, the first contact layer 150 may not be formed.

Figure 5:
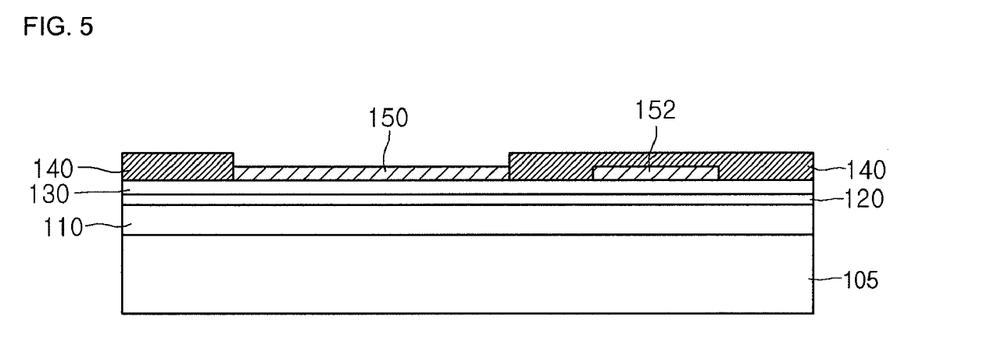

Referring to FIG. 5, a first insulating layer 140 is formed on the outer circumference of the upper surface of the second conductive type semiconductor layer 130. The first insulating layer 140 may be formed of insulating material such as $SiO_2$, $Si_3N_4$, $Al_2O_3$, and $TiO_2$, etc., having a thickness of 0.1 to 2 μm. The first insulating layer 140 is formed on in a predetermined area using a mask patterns.

The first insulating layer 140 is formed on an area other than the first contact layer 150, thereby sealing the second contact layer 152.

Figure 6:
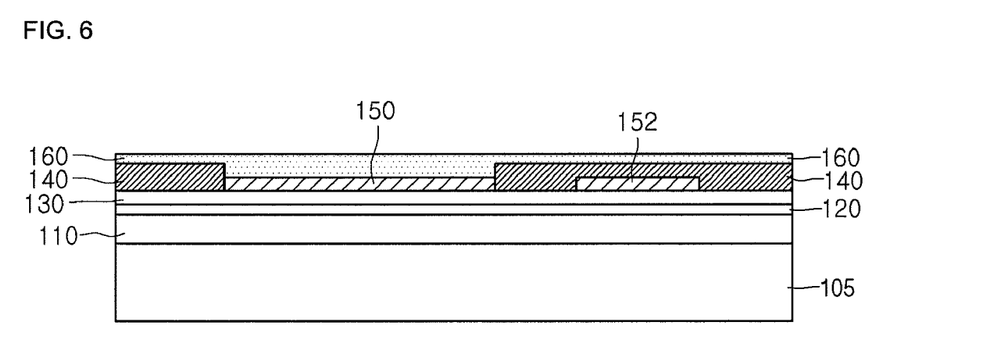
Figure 7:
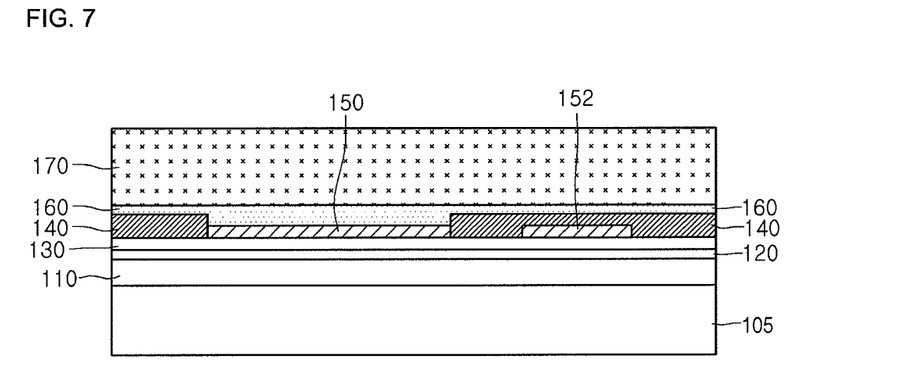

Referring to FIGS. 6 and 7, a second electrode layer 160 is formed on the first insulating layer 140 and the first contact layer 150. The second electrode layer 160 may be formed at least one of Al, Ag, Pd, Rh, and Pt, a metal material of a reflectivity of 50% or more, etc. or an alloy thereof, etc.

A conductive supporting member 170 is formed on the second electrode layer 160, wherein the conductive supporting member 170 may be implemented as copper (Cu), gold (Au), nickel (Ni), molybdenum (Mo), copper-tungsten (Cu—W), carrier wafers (e.g.: Si, Ge, GaAs, ZnO, and Sic etc.).

Figure 8:
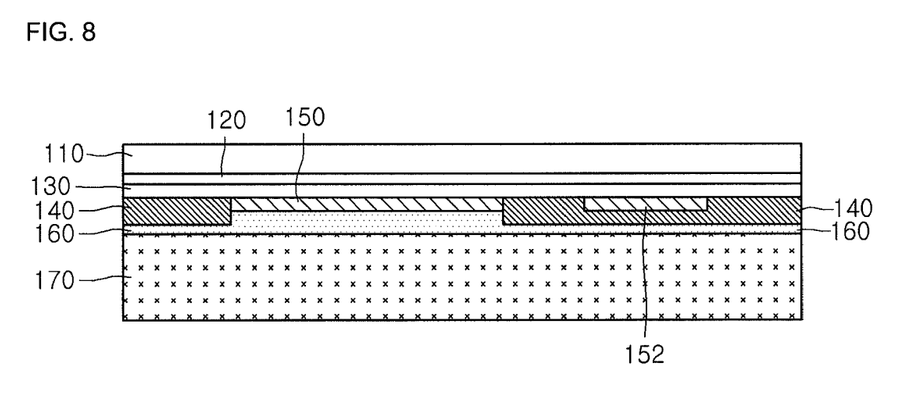

Referring to FIGS. 7 and 8, after the conductive supporting member 170 is positioned on a base, the substrate 105 is removed. The substrate 105 may be removed using a physical and/or chemical method. With the physical method, the substrate 105 is removed through a laser lift off (LLO) process. In other words, the substrate 105 is separated using a laser having a wavelength in a predetermined area to the substrate 105. With the chemical method, when any semiconductor layer (e.g.: a buffer layer) is formed between the substrate 105 and the first conductive type semiconductor layer 110, the substrate may be separated by removing the buffer layer using a wet etching method. A polishing process in an inductively coupled plasma/reactive ion etching (ICP/RIE) may be performed on the first conductive type semiconductor layer 110 of which substrate 105 is removed.

A roughness pattern may be formed in the top surface of the first conductive type semiconductor layer 110, but it is not limited thereto.

The first contact layer 150 reinforces the adhesion between the second conductive type semiconductor layer 130 and the conductive supporting member 170, thereby protection the semiconductor light emitting device from the external impact. Therefore, the electrical reliability of the semiconductor light emitting device can be improved.

Figure 9:
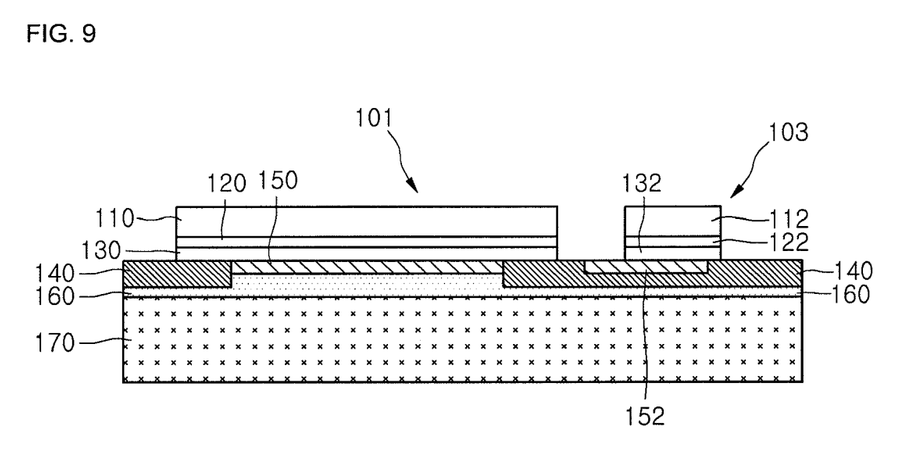

Referring to FIG. 9, after the conductive supporting member 170 is positioned on a base, light emitting unit 101 and electrostatic protection unit 103 are formed so as to be electrically separated. In one embodiment, the structure of the first conductive type semiconductor layer 110, first active layer 120, and second conductive type semiconductor layer 130 are separated into two areas by performing wet and/or dry etching process on a boundary area between the light emitting unit 101 and the electrostatic protection unit 103 and the circumference of the chip.

Thereby, a third conductive type semiconductor layer 112 is separated from the first conductive type semiconductor layer 110, a second active layer 122 is separated from the first active layer 120, and a second a conductive type semiconductor layer 132 is separated from the second conductive type semiconductor layer 130. The second contact layer 152 is disposed under the fourth conductive type semiconductor layer 132 of the electrostatic protection layer 103.

Figure 10:
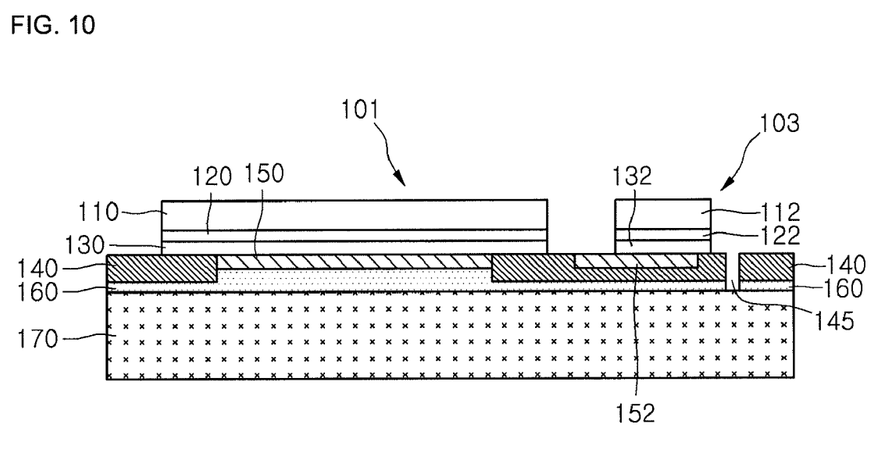

Referring to FIG. 10, a wiring groove 145 from the bottom surface of the first insulating layer 140 through the reflective electrode layer 160 or the portion of the conductive supporting member 170 is formed. The wiring groove 145 is formed on the other side of the electrostatic protection unit 103 so as to be spaced from the second contact layer 152.

Figure 11:
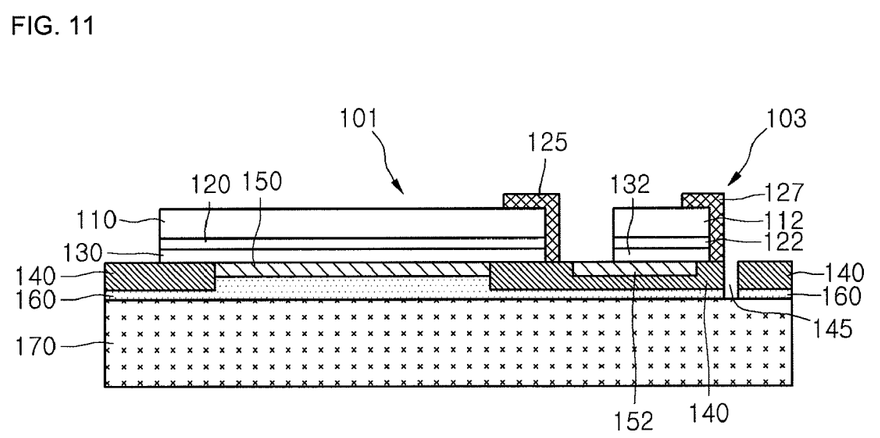
Figure 12:
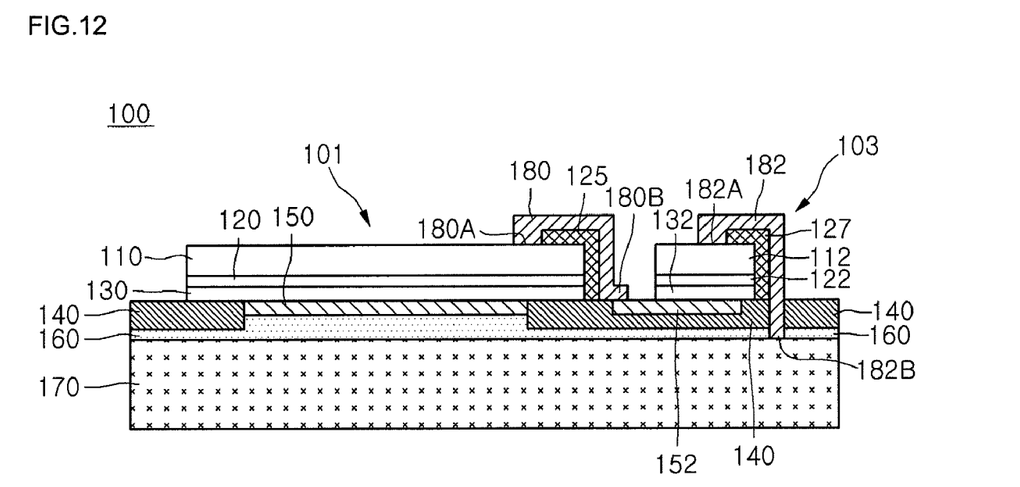

Referring to FIGS. 11 and 12, a second insulating layer 125 is formed on one of the sides of the layers 110, 120, and 130 of the light emitting unit 101. The second insulating layer 125 is formed on the outer side of the light emitting unit 101 to prevent the short between the respective layers 110, 120, and 130 of the light emitting unit 101.

A third insulating layer 127 is formed on the sides of the respective layers 112, 122, and 132 of the electrostatic protection unit 103. The third insulating layer 127 is formed on the outer side of the electrostatic protection unit 103, making it possible to prevent a short between the respective layers 112, 122, and 132 of the electrostatic protection unit 103.

The second insulating layer 125 and the third insulating layer 127 may selectively use the material of the first insulating layer 140, having the thickness of about 0.1 to 2 μm. The second insulating layer 125 and the third insulating layer 127 are formed in a predetermined area using a mask patterns.

A first electrode layer 180 connects the light emitting unit 101 electrically to the electrostatic protection unit 103, and the wiring layer 182 connects the electrostatic protection unit 103 electrically to the conductive supporting member 170. The first electrode layer 180 and the wiring layer 182 are formed in a predetermined area using a mask patterns.

One end 180A of the first electrode layer 180 is connected to the first conductive type semiconductor layer 110, and the other end 180B thereof is connected to the second contact layer 152 of the electrostatic protection unit 103. One end 182A of the wiring layer 182 is connected to the third conductive type semiconductor layer 112, and the other end 182B thereof is connected to the second electrode layer 160 and/or the conductive supporting member 170. The second insulating layer 125 is disposed under the first electrode layer 180, and the third insulating layer 127 is disposed under the wiring layer 182.

As shown in FIG. 12, a light emitting unit 101 is formed on one side of the semiconductor light emitting device 100, and an electrostatic protection unit 103 is formed on the other side thereof. The electrostatic protection unit 103 is connected to the light emitting unit 101 in parallel based on the second electrode layer 160.

The light emitting unit 101 and the electrostatic protection unit 103 are connected to the first electrode layer 180 in common, and the electrostatic protection unit 103 is connected to the conductive supporting member 170 in common through the wiring layer 182. Thereby, power may be supplied through the first electrode layer 180 and the conductive supporting member 180.

Also, abnormal voltage, for example, ESD, passes through the electrostatic protection unit 103, making it possible to protect the light emitting unit 101.

The embodiment can provide a vertical semiconductor light emitting device having the electrostatic protection unit and the strong ESD immunity, making it possible to improve electrical reliability of the vertical semiconductor light emitting device.

Although embodiments have been described with reference to a number of illustrative embodiments thereof, it should be understood that numerous other modifications and embodiments may be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
a first electrode layer;
a second electrode layer;
a light emitting unit comprising a plurality of compound semiconductor layers under one portion of the second electrode layer,
wherein the light emitting unit includes
a first conductive type semiconductor layer,
a second conductive type semiconductor layer, and
a first active layer between the first conductive type semiconductor layer and the second conductive type semiconductor layer;
a first insulating layer on the second electrode;
an electrostatic protection unit comprising a plurality of compound semiconductor layer under the first insulating layer,
wherein the electrostatic protection unit includes
a third conductive type semiconductor layer,
a fourth conductive semiconductor layer, and
a second active layer between the third conductive type semiconductor layer and the fourth conductive type semiconductor layer; and
a wiring layer electrically connecting the third conductive type semiconductor layer of the electrostatic protection unit to the second electrode layer,
wherein the first electrode layer electrically connects the first conductive type semiconductor layer of the light emitting unit to the fourth conductive type semiconductor layer of the electrostatic protection unit.

2. The semiconductor light emitting device according to claim 1, comprising:
a conductive supporting member on the second electrode layer.

3. The semiconductor light emitting device according to claim 1, comprising:
a second insulating layer between the first electrode layer and at least a portion of the first and second conductive type semiconductor layers; and
a third insulating layer between the wiring layer and at least a portion of the third and fourth conductive type semiconductor layers.

4. The semiconductor light emitting device according to claim 1, wherein the first and second electrode layers have a reflectivity of 50% or more.

5. The semiconductor light emitting device according to claim 1, comprising:
a first contact layer formed between the second conductive type semiconductor layer of the light emitting unit and the second electrode layer; and
a second contact layer that is electrically connected to the first electrode layer on the fourth conductive type semiconductor layer of the electrostatic protection unit.

6. The semiconductor light emitting device according to claim 1, wherein a portion of the first insulating layer is disposed between the electrostatic protection unit and the second electrode layer.

7. A semiconductor light emitting device, comprising:
a first electrode layer;
a second electrode layer comprising a reflective metal;
a first insulating layer on the second electrode layer;
a light emitting unit comprising a plurality of compound semiconductor layers on the second electrode layer;
an electrostatic protection unit comprising a plurality of compound semiconductor layers on the first insulating layer; and
a wiring layer electrically connecting the electrostatic protection unit to the second electrode layer,
wherein the first electrode layer electrically connects a top portion of the light emitting unit to a bottom portion of the electrostatic protection unit.

8. The semiconductor light emitting device according to claim 7, wherein the light emitting unit and the electrostatic protection unit each comprise a respective P type semiconductor layer, an active layer on the respective P type semiconductor layer, and a N type semiconductor layer on the respective active layer.

9. The semiconductor light emitting device according to claim 8, wherein the first electrode layer connects the N type semiconductor layer of the light emitting unit to the P type semiconductor layer of the electrostatic protection unit, and the wiring layer connects the N type semiconductor layer of the electrostatic protection unit to the second electrode layer.

10. The semiconductor light emitting device according to claim 8, wherein the electrostatic protection unit has a cross-sectional width 50% smaller than a cross-sectional width of the second electrode layer.

11. The semiconductor light emitting device according to claim 8, comprising:
a first contact layer between the light emitting unit and the second electrode layer; and
a second contact layer between the electrostatic protection unit and the first insulating layer.

12. The semiconductor light emitting device according to claim 11, wherein the first contact layer and the second contact layer are formed of ITO, IZO(In—ZnO), GZO(Ga—ZnO), AZO (Al—ZnO), AGZO(Al—Ga ZnO), IGZO (In—Ga ZnO), IrOx, RuOx, Ni/IrOx/Au, Ni/IrOx/Au/ITO, Ag, Ni, Al, Rh, Pd, Ir, Ru, Mg, Zn, Pt, Au, Hf, a metallic oxide, and material consisting of a selective combination thereof.

13. The semiconductor light emitting device according to claim 7, wherein the light emitting unit and the electrostatic protection unit each comprise a respective second N type semiconductor layer, a P type semiconductor layer on the respective second N type semiconductor layer, an active layer on the respective P type semiconductor layer, and a first N type semiconductor layer on the respective active layer.

14. The semiconductor light emitting device according to claim 9, comprising:
a second insulating layer between the first electrode layer and the light emitting unit; and
a third insulating layer between the wiring layer and the electrostatic protection unit.

15. The semiconductor light emitting device according to claim 7, wherein a portion of the first insulating layer is disposed between the electrostatic protection unit and the second electrode layer.

16. A semiconductor light emitting device, comprising:
a first electrode layer;
a second electrode layer comprising reflective metal;
a first insulating layer on the second electrode layer;
a light emitting unit comprising a plurality of compound semiconductor layers on the second electrode layer;

an electrostatic protection unit comprising a plurality of compound semiconductor layers on the first insulating layer;

a second contact layer between the electrostatic protection unit and the first insulating layer; and a wiring layer electrically connecting the electrostatic protection unit to the second electrode layer, wherein the first electrode layer electrically connects the light emitting unit to the second contact layer.

17. The semiconductor light emitting device according to claim 16, wherein the light emitting layer and the electrostatic protection unit have a common stacked structure using a III-V group compound semiconductor.

18. The semiconductor light emitting device according to claim 16, comprising:

a conductive supporting member that directly contacts an end of the wiring layer.

19. The semiconductor light emitting device according to claim 16, wherein a portion of the first insulating layer is disposed between the electrostatic protection unit and the second electrode layer.

* * * * *